United States Patent [19]

Reichlin et al.

[11] Patent Number: 4,656,351

[45] Date of Patent: Apr. 7, 1987

[54] METHOD AND APPARATUS FOR CONTROLLING A LOAD

[75] Inventors: Anton Reichlin; Marcel Züblin, both of Winterthur, Switzerland

[73] Assignee: Marcel Zublin, Switzerland

[21] Appl. No.: 681,953

[22] Filed: Dec. 14, 1984

[30] Foreign Application Priority Data

Jun. 5, 1984 [CH] Switzerland ............... 2726/84

[51] Int. Cl.[4] .............................................. G01V 9/04
[52] U.S. Cl. ................................ 250/221; 250/222.1
[58] Field of Search ........................... 250/221, 222.1; 315/149, 150, 151, 153; 340/567

[56] References Cited

U.S. PATENT DOCUMENTS 4,560,912 12/1985 Jönsson ..................... 250/221 X

Primary Examiner—Eugene R. Laroche
Assistant Examiner—Steven J. Mottola
Attorney, Agent, or Firm—Lerner, David, Littenberg, Krumholz & Mentlik

[57] ABSTRACT

Methods and apparatus for controlling a load with an electronic sensor are provided in accordance with the teachings of the present invention. Upon a detection of a condition to which a sensor is responsive and an initiation of a switching of a load, further switching of the load by the sensor is inhibited for predetermined intervals. The predetermined intervals are determined in relation to avoidance of switching conditions not aptly representative of actual conditions to be sensed, such as those imposed by the switching of the load.

35 Claims, 4 Drawing Figures

METHOD AND APPARATUS FOR CONTROLLING A LOAD

BACKGROUND OF THE INVENTION

This invention relates to methods and apparatus for controlling a load, and more particularly, to methods and apparatus for controlling a load with a sensor wherein the sensor is responsive not only to a condition to be sensed but also to an enabling or disabling of the load.

The automatic control of loads, for example illumination systems, operated by AC or DC networks through the use of sensors is well known. Thus, highly convenient arrangements have been developed, for instance, wherein infrared sensors are employed to control an illumination system under conditions where an individual's entry into a room equipped with such a system results in the illumination system being automatically actuated. When the person leaves the room, the illumination system is again extinguished.

If the infrared sensor employed in such a system is a low-sensitivity device requiring that it be located at a relatively confined point of entry and exit, such a system may be operated without difficulty. However, when the sensitivity of the infrared sensor employed is increased to accommodate more generalized applications, such an increase in sensitivity will invariably result in the sensor's operation being adversely effected by switching of the controlled load which, in the case being discussed, is an illumination system. Thus it will be seen that when such a control arrangement employs a high-sensitivity infrared sensor it will be activated when an individual comes into the long range of the sensor. However, as soon as the illumination system is activated, the very activation thereof may be sensed to cause again a deactivation of the illumination system. Furthermore, in systems of this type when the sensitivity of the sensor is increased by way of amplification or the like, feedback of load transients and/or spikes on the electrical supply associated with the switching of the load may also result in uncontrolled possibly oscillatory switching of the load as a function of the sensor being employed. This is highly disadvantageous and has generally rendered such highly sensitive switching arrangements impractical.

Ordinarily, the infrared sensors employed in such systems are operated in a manner that the same are responsive to signal changes rather than stationary signal conditions. Therefore, those of ordinary skill in the art will readily appreciate that infrared sensors which are relatively sensitive are greatly subject to erroneous operation during intervals when an illumination load, for example, is being switched on, and conversely when the same is being switched off. More particularly, in an illumination system of the type being described, it will be appreciated that the system should switch on when an individual walks into a room and switch off when the individual leaves the room. However, during the time interval when the individual is in the room and the illumination system is on, normal activities of that individual within the room should cause the infrared sensor to keep the illumination on.

Ideally, when a lighting system is switched on by an infrared sensor, a first time interval should be imposed on that sensor during which transients generated by the actuation of the load will not cause spurious switching. This interval should exceed the interval of transient conditions associated with the load. Furthermore, once the interval of transient conditions associated with the load has expired, the sensed conditions which may well be associated with the movement of an individual within the range of the sensor are employed solely for an extension of the period of illumination and switching associated with turning off of the light only occurs when no signal changes have occurred within a given time span additionally or alternatively. Once the illumination system has been switched off, any detection of a sensed condition should again energize the system, but a zone which avoids transient switching associated with a turning off of the load must also be established.

When it is desired to convert an existing illumination system which is typically manually switched to an electronic system employing infrared sensors, further difficulty is typically encountered. More particularly, such systems are generally actuated through the presence of a manual switch connected in series with the lighting load and no neutral conductor is usually present. Therefore, in altering such a manual system to employ electronic switching, great difficulties are encountered in developing techniques for providing the supply voltage already in place to the electronics which are being introduced for purposes of switching. As no neutral conductor is normally installed and only one switch-interrupted conductor to the load, a way has to be found to develop a DC-supply voltage from these conditions for installation. Thus, those of ordinary skill in the art will appreciate that when a manually switched system is to be converted to an electronically sensed system it is most desirable that such changeover be provided without a need for substantial modifications in the wiring already in place.

Therefore, it is a principal object of the present invention to provide methods and apparatus for controlling a load switched by a sensor.

An additional object of the present invention is to provide methods and apparatus for avoiding spurious switching on and/or off a load controlled by an infrared sensor.

A further object of the present invention is to provide techniques for converting existing manually switched loads to sensor controlled switching without the introduction of substantial wiring changes in the existing system.

Various other objects and advantages of the present invention will become clear from the following description of several exemplary embodiments thereof and the novel features will be particularly pointed out in conjunction with the claims appended hereto.

SUMMARY OF THE INVENTION

In accordance with the teachings of the present invention, methods and apparatus for controlling a load with an electronic sensor are provided wherein upon a detection of a condition to which the sensor is responsive and an initiation of a switching on and/or off of a load, further switching of the load by the sensor is inhibited for predetermined intervals determined in relation to avoidance of switching conditions not aptly representative of actual conditions to be sensed.

BRIEF DESCRIPTION OF THE DRAWINGS

The invention will be more clearly understood by reference to the following detailed description of several exemplary embodiments in conjunction with the accompanying drawings in which.

DETAILED DESCRIPTION

Figure 1:
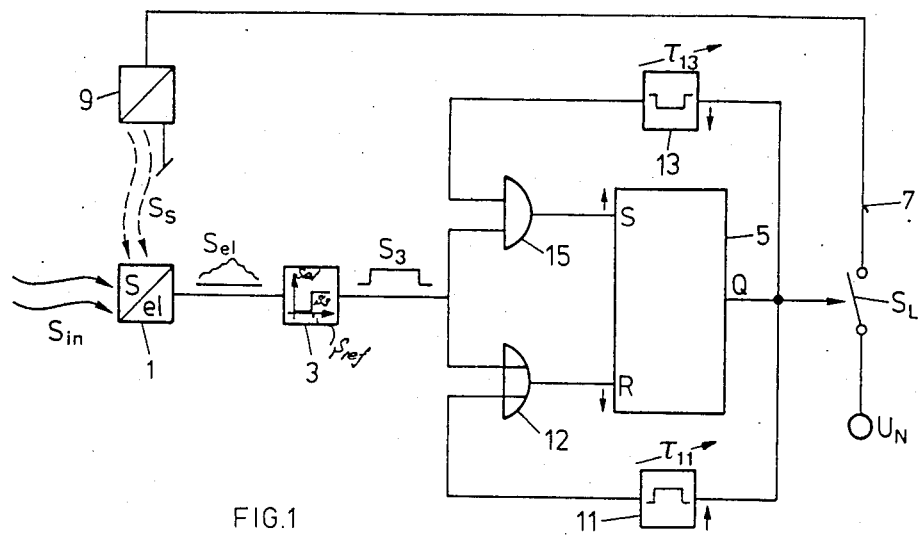
FIG. 1 is a block diagram serving to schematically illustrate a preferred embodiment of a control system according to the present invention wherein after each switching operation, the resulting condition is maintained for a predetermined interval to avoid further switching induced by a load.

Referring now to the drawings, and more particularly to FIG. 1 thereof, there is shown a diagram of a preferred embodiment of the instant invention. The embodiment of the invention illustrated in FIG. 1 comprises a sensor 1 which may take the form of a conventional infrared radiation sensor, a comparator 3 and a bistable unit 5 which may take the form of a conventional flip-flop or the like which acts to control the condition of a load switch $S_L$ in a circuit 7 for energizing a load 9. The infrared sensor 1 may take any of the well-known forms of this conventional class of device and acts to transduce infrared energy detected thereby to an electric signal indicated as $S_{el}$ in FIG. 1. The output of the sensor 1 after any necessary amplification is connected, as illustrated in FIG. 1, to a comparator unit 3. The comparator unit 3 may take any of the well-known forms of this conventional class of device and acts to provide an output signal $S_3$ in response to an input provided thereto exceeding a predetermined threshold $S_{ref}$. The output $S_3$ provided by the comparator unit 3 may be viewed as a typical digital signal with 1 and 0 values assigned. Those of ordinary skill in the art will appreciate that the threshold assigned to the comparator 3 effectively controls the sensitivity of the control system disclosed in response to the output of the sensor 1.

The output of the comparator 3 is connected, as plainly indicated in FIG. 1, through a pair of gates 12 and 15 to the set and reset (S and R) inputs of the bistable unit 5 in a conventional edge-triggered switching configuration. The bistable unit 5, which may take the form of a conventional flip-flop as aforesaid, is set by input conditions associated with the comparator 3 such that it is set on the leading edge of the output signal $S_3$ and conversely reset by the trailing edge of such signal $S_3$. This means that typically when a switch condition is detected by the sensor 1 of sufficient magnitude to cause the comparator 3 to generate a 1, the flip-flop 5 will be set on the leading edge of this output to coincide with the detection of the condition. Conversely, flip-flop 5 will be reset when the comparator's output falls to 0, which again would coincide with a disappearance of the condition detected by the sensor 1. The Q output of the bistable unit 5 is connected, as indicated in FIG. 1, to control a load switch $S_L$ in the circuit 7 for the load 9. Switch $S_L$ may be relay driven or the like and those or ordinary skill in the art will readily appreciate that when the same is in a closed condition, voltage is applied through the circuit 7 to the load 9 to cause the energization thereof from the load-supply-source indicated as $U_N$. When the switch $S_L$ is open, the load 9, which may be viewed as an illumination system or the like, is deenergized. During time intervals when the switch $S_L$ is being closed or being opened, the load 9 will itself provide signals, indicated as spurious signals $S_S$ in FIG. 1, of the same type as are normally detected by the sensor 1. Thus, in the case of an illumination system infrared signal changes will occur whenever the load is being switched on or being switched off. These signals will be detected by the sensor 1 and, absent the control arrangement herein provided, may cause the sensor 1 to generate sufficient output signals to change the state of the bistable unit 5 and further induce switching of the load through the action of the switch $S_L$.

In order to prevent such spurious switching, the output of the bistable unit 5 is connected, as indicated in FIG. 1, to a pair of monostable devices 11 and 13 as of monostable multivibrators, commonly known as Monoflops, each of which is provided with an adjustable duty cycle. Each of the monostable devices 11 and 13 may take any of the conventional forms of this well-known class of device and acts to assume a set state upon the occurrence of a switching input, to reside in that set state for a predetermined interval which is here adjustable and then to revert into its initial condition. The monostable 11, as indicated in FIG. 1, is connected to be switched by a positive leading edge associated with the output of the flip-flop 5 while the monostable 13 conversely is connected to be set by a falling trailing edge associated with the Q output of the flip-flop 5.

Both the output of the monostable 11 and the output of the comparator 3 are connected to the reset input of the flip-flop 5 through respective inputs of an OR gate 12 which is sensitive to negative transitions which here occur as a trailing edge of the output of either the comparator 3 or the monostable 11. This means that once the output of the comparator 3 has gone high, flip-flop 5 will not be reset even if the output signal $S_3$ terminates until duty cycle $T_{11}$ associated with the monostable 11 has terminated. Once the flip-flop 5 has been set by conditions detected by the sensor 1, the switch $S_L$ will be closed and will remain closed until at least the period associated with the interval $T_{11}$ of the monostable 11 has expired. This insures that spurious switching will not occur as a result of signal $S_S$ detected by the sensor 1 upon an energizing of the load.

Conversely, the second monostable 13 is provided to control intervals associated with an opening of the switch $S_L$ which is a consequence of the resetting of the flip-flop 5. This avoids spurious signals generated by the load 9 from causing the infrared sensor 1 to again switch on the load. More particularly, when the load is to be deenergized and the switch $S_L$ opened, the output of the comparator 3 will have gone to 0 and the timing interval associated with monostable 11 will have expired whereupon a resetting input will be applied from the output of the OR gate 12 to the input R of the flip-flop 5 to cause the Q output thereof to go low and open the switch $S_L$.

When the Q output of the flip-flop 5 goes low, the negative edge associated therewith will cause monostable 13 to be set and to remain in its set condition for the duty cycle $T_{13}$ thereof. The output of the monostable 13 is connected to the set input of the flip-flop 5 through the AND gate 15, as clearly illustrated in FIG. 1. Thus, one input to AND gate 15 will be clamped in a low condition for the interval associated with the duty cycle of the monostable 13. This means that if upon deenergizing of the load 9 spurious signals associated therewith are detected by the sensor 1 which are sufficient to exceed the threshold of comparator 3, the high level associated therewith and applied to the second input of AND gate 15 will not be effective to set the flip-flop 5. This results since the second input of AND gate 15 connected to monostrable 13 is low and will remain in this condition until the duty cycle $T_{13}$ thereof has expired. Thus, spurious switching associated with a deenergizing of the load 9 is also avoided.

In operation of the embodiment of the invention illustrated in FIG. 1, it will be seen that if switch $S_L$ is open and the sensor 1 detects infrared energy, the comparator 3 will generate a 1 level output assuming that the energy detected results in an output from the sensor 1 which exceeds the threshold of comparator 3. If it is further assumed that the flip-flop 5 has been in the reset condition for an interval greater than the duty cycle of the monostable 13, the input to AND gate 15 associated with the monostable 13 will be high. This means that the leading edge of the output of the comparator 3, when the ouput goes to its 1 state, will cause the output of AND gate 15 to go high causing setting the flip-flop 5. The switch $S_L$ will thus be closed energizing load 9 and causing the monostable 11 to be set.

When the monostable 11 is set by the leading edge of the Q output of the flip-flop 5 going high, a high level is placed on the lower input to OR gate 12 for the interval associated with the duty cycle of the monostable 11. This means that when the load 9 is being energized, or assuming some other condition occurs during the interval $T_{11}$ which causes the output of the sensor 1 to go low, the resumption of a 0 state by the comparator 3 will not cause a resetting of the flip-flop 5 since a high is supplied to at least one input of the OR gate 12 for the duty cycle of the monostable 11. If upon expiration of the duty cycle of the monostable 11 the output of the comparator 3 has remained in its 0 state, resetting of the flip-flop 5 will occur. Thus, once the flip-flop 5 is set, all detections by the sensor 1 appropriate for again switching the flip-flop 5, and hence, deenergizing the load 9, will be ignored for an interval corresponding to the duty cycle of the monostable 11.

Conversely, once the load 9 has been energized for a period which exceeds the duty cycle $T_{11}$ of monostable 11, a new input to the sensor 1 calculated to cause a deenergizing of load 9 will result in a low level at both inputs of the OR gate 12. This will cause a resetting of the flip-flop 5, a setting of the monostable 13 and an opening of the switch $S_L$ causing a deenergization of the load. If during deenergization of the load another condition is sensed by the sensor 1 which would cause the output of the comparator 3 to assume its 1 state, the high level associated therewith applied to AND gate 15 will be ignored since the second input to AND gate 15 is clamped low for the complete duty cycle of the monostable 13. Thus, all such inputs are ignored for the interval associated with the duty cycle of the monostable 13.

Once the period of the duty cycle of the monostable 13 has again expired, the input provided by the monostable 13 to AND gate 15 again goes high. This means that further conditions sensed by the sensor 1 which cause the comparator 3 to go high will again cause a setting of the flip-flop 5 and an energizing of the load 9. However, in each case those of ordinary skill in the art will appreciate that a dead zone is established for each energization and deenergization of the load wherein spurious inputs detected by the sensor 1 will be wholly ignored by the switching circuit to thus avoid spurious switching during these intervals.

Figure 2:
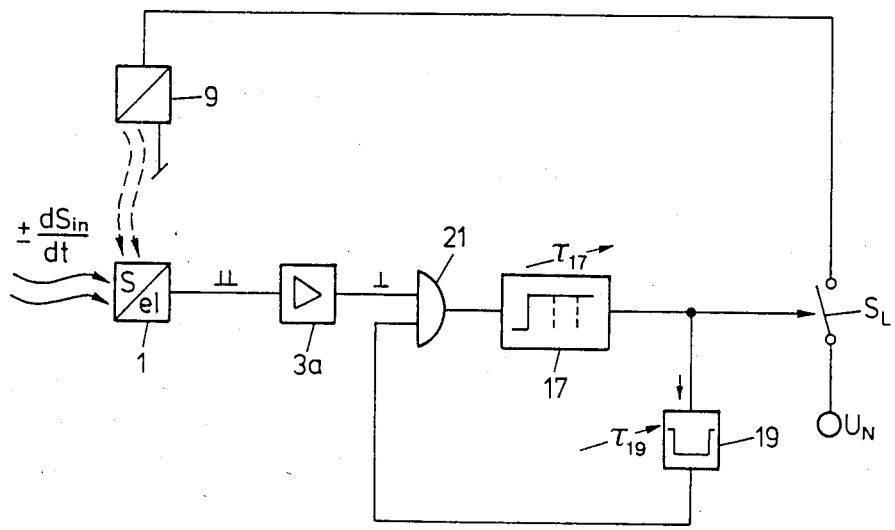
FIG. 2 is a block diagram of another embodiment of the present invention wherein switching made available as a function of the sensor is controlled in relation to a previously established condition of the load.

Referring now to FIG. 2, there is shown a block diagram of another embodiment of the present invention wherein switching made available as a function of the sensor is controlled in relation to a previously established condition of the load. More particularly, the embodiment of the invention illustrated in FIG. 2 comprises an infrared sensor 1, an amplifier 3, first and second monostable devices 17 and 19 as monflops and an AND gate 21 for controlling a lighting load 9 through a switch $S_L$. The lighting load 9 and switch $S_L$, together with the load supply voltage source $U_N$ therefor each may take precisely the same form described in FIG. 1. Additionally, the sensor 1 may take the same form of infrared sensing device also described in connection with FIG. 1 with the single exception that the same is here made responsive to changes $dS_{in}/dt$ as indicated in the figure. Those of ordinary skill in the art will appreciate that the infrared sensor 1 thus acts to produce a pulse output of one polarity or the other as a function of changes in the ambient condition sensed of a type, for instance typically employed for room surveillance to indicate the presence of an individual or the like within the room being monitored.

The output of sensor 1 is connected to an amplifier $3_a$ which acts in the conventional manner to amplify and shape any input signal applied thereto and further apply such input through one input to AND gate 21. Assuming that the AND gate 21 is enabled, the input is applied to a retriggerable monostable device 17 known as retriggerable monflop. The monostable device 17 may take any of the conventional forms of this well-known class of device which acts to assume its set condition upon the receipt of an input supplied thereto and to remain in such set condition for the first duration $T_{17}$ which, as indicated in the figure, is preferably adjustable. Additionally, further inputs supplied to the monostable device 17 cause a retriggering thereof to again start the period $T_{17}$ from such further inputs. The output of the monostable device 17 is applied directly or possibly by a driver (not shown), as indicated, to control the open or closed condition of the switch $S_L$, and hence, the state of energization of lighting load 9. Additionally, the output of the monostable device 17 is applied to the input of a second monostable device 19 which may take precisely the same form of edge triggered device as monostable device 13 illustrated in FIG. 1. The monostable device 19 again has an adjustable duty cycle and its output is applied, as indicated in FIG. 2, to a second input of the AND gate 21.

The embodiment of the invention illustrated in FIG. 2 acts to establish, through the operation of the monostable device 17, a first interval during which a lighting load may be turned on in response to a change in the input level sensed by the sensor 1 and is maintained on as further inputs are received during the duty cycle associated with the monostable device 17 each time restarted. If no further inputs are received from the sensor 1, energization of the lighting load 9 will terminate upon the falling edge produced by the monostable device 17 upon the expiration of its duty cycle since the last input did occur. However, the receipt of further inputs prior to expiration of the duty cycle will retrigger the same and continue operation of the load.

If the monostable device 17 resumes its normal reset state, the lighting load 9 is deenergized upon an opening of the switch $S_L$ in the same manner described in connection with FIG. 1. When the lighting load 9 is deenergized, this normally would produce a sufficient change in ambient level so that the sensor 1 will produce an output which would again initiate operation of the monostable device 17 and actuation of the load. It has to be noted that usually output pulses of both polarities occur at the output of sensor 1 for each signum ± of dSin/dt. Hence, if this were permitted, it will be appreciated by those of ordinary skill in the art that each time the lighting load 9 were deenergized, the same would generate an input which was sufficient to again cause the same to be energized so that the oscillatory duty cycle thereof would correspond to intervals of illumination associated with the period $T_{17}$ followed by brief intervals in which the lighting load were disabled. This would continue on an alternating, oscillating basis.

To avoid cycles of operation wherein the load actuates the setting of the monostable device 17, the monostable device 19 is employed to create a dead zone associated with each deenergization of load 9 upon a return of the monostable device 17 to its normal state. The dead zone interval indicated by $T_{19}$ is adjustable and is selected to correspond to an interval which is sufficient to avoid any transient switching in the sensor 1 associated with signal changes induced by a deenergizing of the lighting load 19. More particularly, as will be seen upon an inspection of FIG. 2, whenever the monostable device 17 returns to its normal state, the negative trailing edge associated with this condition is applied to the monostable device 19 to cause the same to be set in the manner indicated in the figure. This will apply a negative or zero level to one input of AND gate 21. With one input to AND gate 21 thus held low, no positive level associated with a output of the sensor 1 will cause the output of AND gate 21 to go high as this logic condition requires both inputs to AND gate 21 to be high. Accordingly, the AND gate 21 effectively acts to isolate the monostable device 17 from the output of the sensor 1 until such time as the interval $T_{19}$ has expired and the monostable device 19 returns to its normally high condition. This, in effect, prevents a deenergizing of the load 9 upon termination of the duty cycle of the monostable device 17 from again reinitiating an actuation cycle for the lighting load 9 through a resetting of the monostable device 17.

Thus, it is seen that the embodiment of the invention illustrated in FIG. 2 establishes a mode of operation wherein any time the lighting load is actuated, the same is held on for as long as further inputs are received plus a fixed interval. However, once resetting through operation of the monostable device 17 occurs, the load is effectively held in an off condition due to the action of monostable device 19 until such time as it is certain that transients associated with the deenergization of the load have terminated. This prevents an oscillatory mode of operation of the switch $S_L$ which can arise due to transients associated with the load which would result in deenergizing of the load only for relatively short intervals.

Figure 3:
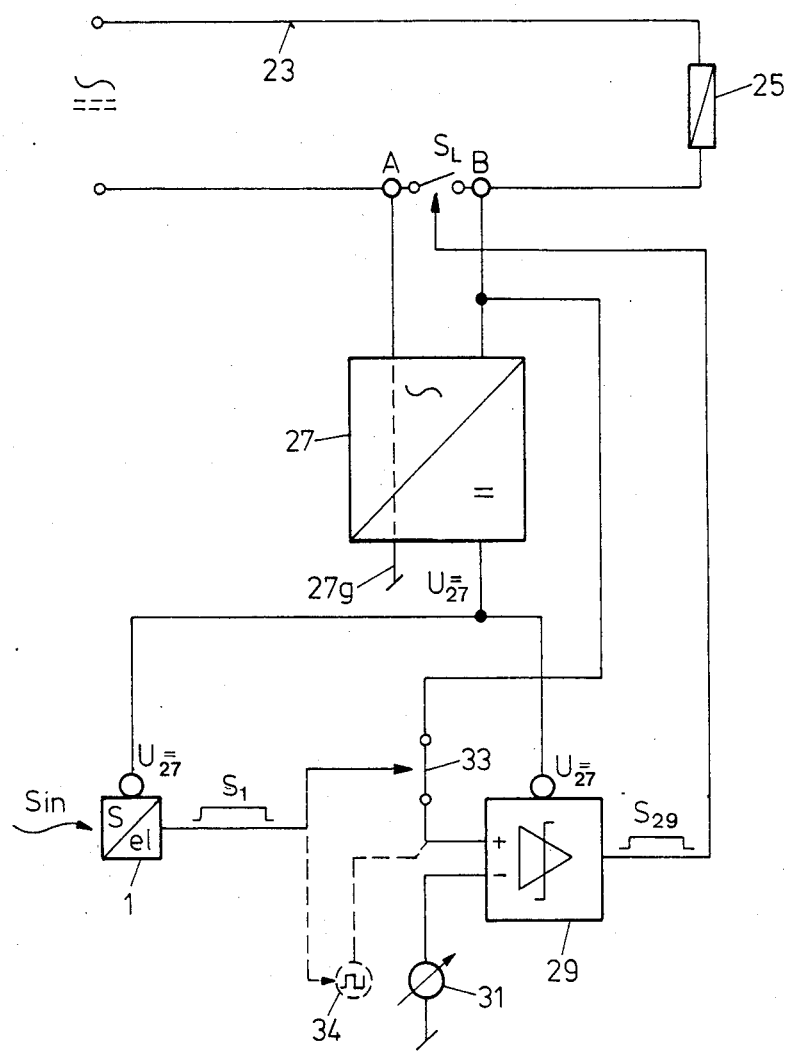
FIG. 3 shows a schematic block diagram of a further embodiment of the instant invention particularly configured to accommodate direct connection with a series switch for actuating a load having an AC or DC. supply circuit.

Referring now to FIG. 3 there is shown a schematic block diagram of a further embodiment of the present invention particularly configured for direct replacement of a manual switch arrangement in controlling a load actuated from an AC or DC supply. The embodiment of the invention illustrated in FIG. 3 comprises a load circuit 23 arranged to drive a load 25, such as a lamp or other lighting arrangement. The load circuit 23 may be powered by an AC-,indicated by the solid line, or DC-, indicated by the dashed lines, load-supply. The load circuit 23 connects the supply to the load 25 through conventional switch span AB which is usually configured to have a conventional manual switch connected thereacross. In the embodiment of the invention illustrated in FIG. 3 a load switch SL which may be a semiconductor or a relay activated device is connected across the terminals AB of a switchbox provided in the customary manner for a manual switch associated with a lighting load. Additionally, connected across the terminals AB is an AC to DC converter 27 which acts to convert a voltage received from the terminals AB to a DC potential indicated in FIG. 3 as $U_{27}$ and referred to ground as indicated by 27G. This ground is not the ground of the circuit 23 but "system" ground of the system further described. The voltage developed by the AC to DC converter 27 is employed for purposes of supplying DC-supply power to all components employed in the embodiment of the invention illustrated in FIG. 3 which need such a supply. Thus for instance the potential $U_{27}$ is employed as indicated in FIG. 3 for supplying power to an infrared sensor 1 which may take the same form as described in association with FIG. 1 as well as a comparator unit 29, etc.

Figure 4:
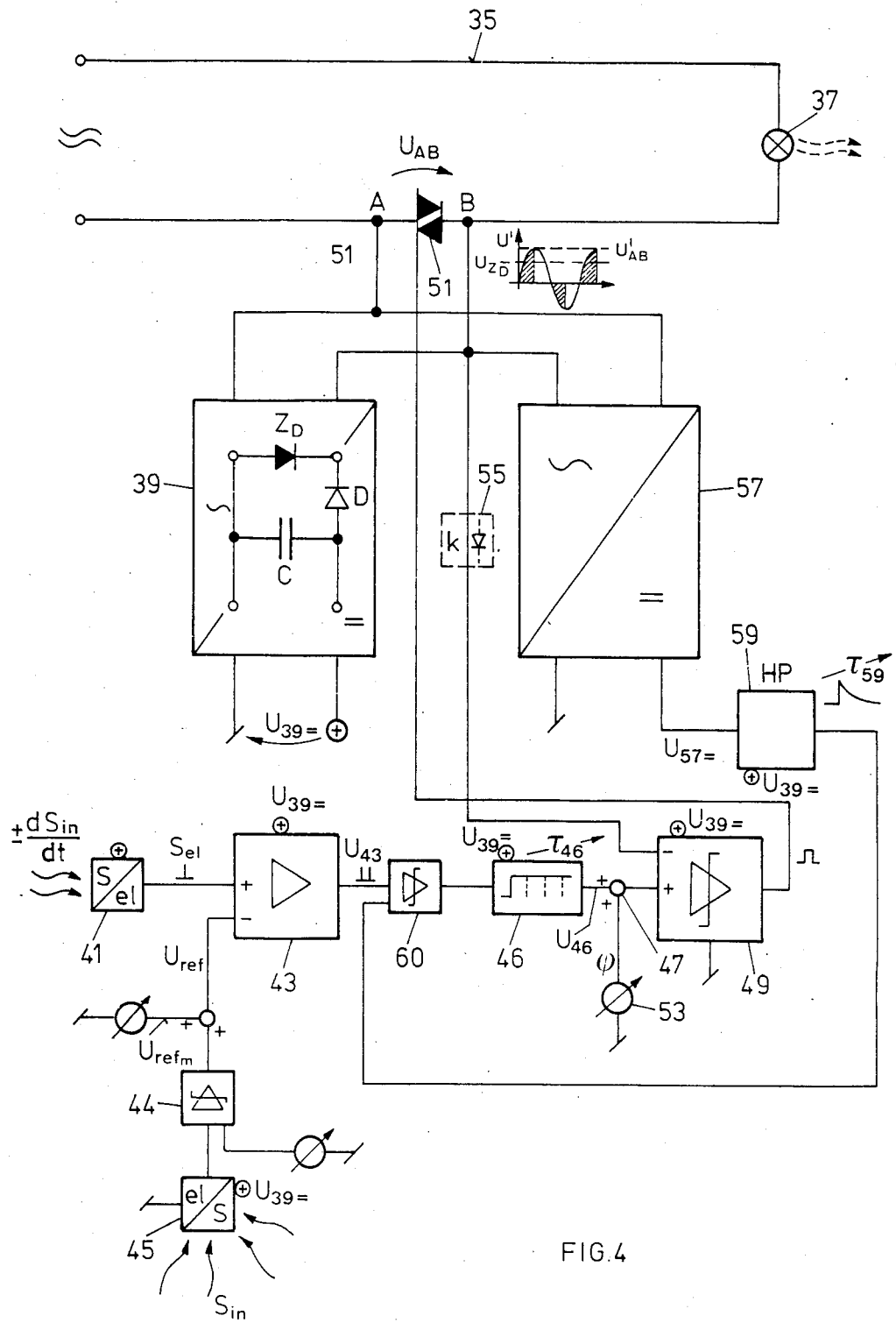
FIG. 4 is a block diagram schematically illustrating a further embodiment of the invention suited for direct connection to existing circuitry for controlling an AC-driven load.

The AC to DC converter 27 may take any of the well known forms of this conventional class of device. In this regard, a rectifier-filter combination such as illustrated in FIG. 4 may be employed or a rectifier bridge with ripple rejection capacitor.

The sensor 1 illustrated in FIG. 3 produces an output S1 in response to a detection of the condition to be sensed. In this case such condition may correspond, as aforesaid, to infrared energy associated with the passage of an individual into a room or also that associated with the lighting load 25 to be automatically controlled. Upon receipt of an appropriate input energy level the sensor 1 will produce an output in the form indicated by the wave form S1 in FIG. 3, and those of ordinary skill in the art will appreciate that while the same has not been shown in FIG. 3 an appropriate threshold device such as the comparator 3 in FIG. 1 may be employed for this purpose. The output of the sensor 1 is connected, in the case of an AC supplied load, directly to a switch 33 which may be a relay actuated or semiconductive device. Thus, whenever sufficient energy is detected by sensor 1 to actuate the lighting load 25, the switch 33 is placed in the closed condition illustrated in FIG. 3 while when the load 25 is to be de-energized, the switch 33 is opened.

The comparator unit 29 may take any of the conventional forms of this well-known class of device and acts as will be readily appreciated by those of ordinary skill in the art to produce an output, shown as $S_{29}$ in FIG. 3 whenever the input thereto exceeds a predetermined threshold level. The input to the comparator 29, in the case of an AC supplied load is provided directly from terminal B whenever the switch 33 is in a closed condition. The comparator 29 is provided with an adjustable reference voltage derived from the output of AC/DC converter 27 by means of direct connection of the negative input of the comparator 29 to an adjustable voltage source 31. Those of ordinary skill in the art will appreciate that when the switch 33 is in a closed position, the output of the comparator 29 will take the form of an output pulse train $S_{29}$ produced at a rate corresponding to the frequency of the load-AC-supply. This again assumes that AC load operation is involved and pulses of the pulse train will occur only when the potential at terminal B with respect to A exceeds the reference voltage applied by source 31 to comparator 29. Thus the duty cycle of the output-pulse train $S_{29}$ will be the period of the power supply AC-signal to line 23 but the impulses will only last as long as the amplitude of the supply-AC-voltage is higher than the reference voltage of source 31. As when the switch $S_L$ is closed there will be no voltage across AB and when the switch $S_L$ is opened, the voltage across AB will follow the power supply voltage, it becomes clear that with the switch $S_L$ being closed intermittently during periods which are shorter than half a period of the supply voltage, there will remain even during intermittent operation of the switch $S_L$ an AC voltage across AB and thus the output voltage of the AC/DC converter will drop as soon as the switch $S_L$ is intermittently operated but will remain on a sufficient level to supply the electronic means shown in the figure. If for instance the AC/DC converter is provided with a two-way rectifier bridge and as the source 31 does only provide a reference voltage of one polarity it is then only every second half-wave of the power supply AC voltage that will be phase-cut, the remaining AC voltage across AB will be converted by the AC/DC converter 27. The level of the output voltage of the AC/DC converter 27 when the switch $S_L$ is intermittently operated is set by settlement of the reference signal at source 31 which defines the phase angle at which the voltage across AB is cut. The output of the comparator 29 is supplied through the conductor illustrated in FIG. 3 to intermittently open and close the switch SL across terminals AB thus with a frequency according to the AC-supply frequency and with pulsewidths according to the reference voltage set at source 31.

When switch 33 is in an open condition, it will be appreciated that the switch SL is also continuously opened since no output pulse train is produced under these circumstances by the comparator 29. However, when the switch 33 is placed in a closed condition as a result of the sensor 1 generating a pulse S1 to turn on the lighting load 25, the switch SL will be intermittently opened and closed at a rate corresponding to the frequency of the signals applied to the load circuit 23 from an AC source. The value of the DC output $U_{27}$ of the converter 27 is preferably limited to a value which at most accords to the remaining AC-signal across AB when the load switch SL is intermittently operated. Limiting of the output voltage of the AC/DC converter 27 may for instance be realized by connecting a zener diode between output and ground 27g with the correct polarity. this results in the supply potential $U_{27}$ being substantially independent of the operating condition of the switch $S_L$.

Those of ordinary skill in the art will appreciate that in operation of the embodiment of the invention illustrated in FIG. 3 when no input is detected by the sensor 1 the output of the sensor will be in a zero state so that the switch 33 as well as the load switch $S_L$ will reside in their open condition. Under these conditions, the voltage across the terminals AB which is the then supplied voltage is applied to the AC to DC converter 27 whereupon a DC voltage $U_{27}$ is supplied to both the sensor 1 and the comparator 29, to the source 31. The illumination load 25 is also de-energized and the output of the comparator 29 is zero.

Once the sensor 1 detects suffient infrared energy $S_{IN}$ to cause its output to exceed a predetermined threshold the signal $S_1$ (one) is generated of a predetermined duration, preferably retriggerable by further $S_{in}$-signals which may be realized by connecting a retriggerable monostable multivibrator as was described in FIG. 2 in connection with unit 17, following the sensor 1 of FIG. 3. This results in a closure of switch 33 in much the same manner described in connection with FIGS. 1 or 2. Upon closure of the switch 33, the voltage residing at terminal B with respect to A at system ground 27g is applied through the conductor illustrated and switch 33 to the positive input of the comparator 29. This input voltage is compared to the reference voltage established by the variable source 31 and, assuming an AC input to the load circuit 23, during parts of half cycles when the AB-voltage exceeds the reference voltage associated with source 31, the comparator 29 will provide an output pulse indicated as $S_{29}$. $S_{29}$ will be produced for the interval during which such input voltage across terminals AB exceeds the reference level. Each time a pulse $S_{29}$ is output by the comparator 29 the switch SL will be closed and upon termination of the signal pulse of $S_{29}$ the switch SL will be opened. This will result in the application of a pulsed signal to the lighting load 25 at a rate and with an energy determined by the switching of switch SL and will cause the same to be actuated.

When the condition detected by the sensor 1 terminates the output of the sensor 1 goes to zero causing the switch 33 to open. Upon this occurrence the voltage across terminals AB is no longer applied through switch 33 to the one input of the comparator 29. Under these conditions, the periodic output pulse train of the comparator 29 terminates leaving the switch SL in an open condition thereby de-energizing the lighting load 25.

Those of ordinary skill in the art will appreciate that the embodiment of the invention illustrated in FIG. 3 accommodates efficient conversion of existing manually switched lighting arrangements to automatic operation by employing existing terminals provided for a manual switch as both a source to supply power to the circuitry added and additionally supplying pulsed power to the lighting load as a function of the intermittently operated load switch SL. The load 25 is effectively separated from the power supply by the intermittent operation of the switch $S_L$ across the existing terminals A and B and this occurs at a frequency of repetition corresponding to the frequency of the AC power-supply. In this manner, a pulsed power input is supplied to the load 25.

If the embodiment of the invention illustrated in FIG. 3 is to be operated from a DC supply for the load circuit 23, as indicated by the dashed lines, the manner in which the switch $S_L$ is operated is substantially the same as described above. However, instead of employing the alternating voltage of the supply for control of the comparator 29 and generation of the periodic pulse train $S_{29}$ employed for intermittently opening and closing the switch $S_L$, a pulse generator 34 is provided in the manner indicated by the dashed blocks started and stopped by the signal $S_1$ of the sensor 1. This is done for purposes of responding to the output of the sensor 1 and providing an intermittent control to the positive input of the comparator 29. In this case, a pulsating DC voltage will occur across terminals A and B which will be picked up and smoothed by the converter 27 shown in FIG. 3. As an AC/DC converter as with a rectifier bridge will pass also a DC-voltage at its input as a DC voltage at its output the voltage $U_{27}=$ is also provided at DC-operation when the switch $S_L$ is permanently open. This smoothed DC potential is then employed for supplying the remaining portions of the control circuit illustrated.

Referring now to FIG. 4, there is shown a block diagram schematically illustrating a further embodiment of the invention which is also suited for direct connection to existing circuitry for controlling an AC driven load. More particularly, the embodiment of the invention illustrated in FIG. 4 comprises a sensor controlled electronic switching arrangement arranged for direct substitution into an AC driven, manually operated illumination system 35 having a lighting load 37, illustrated as a lamp. Across the switch terminals A and B where a manually actuated switch is normally connected, is disposed a triac 51 while connected to each of terminals A and B in the manner shown, are a pair of AC to DC converters 39 and 57. The AC to DC converter 39 may take the same form described in connection with FIG. 3 and while the second AC to DC converter 57 may be similar to the AC to DC converter 39 but is not provided with amplitude limitation in the form of a zener diode $Z_D$.

The AC to DC converter 39 connected to terminals A and B acts as described in connection with FIG. 3 to provide a DC output supply voltage $U_{39}=$. This supply voltage $U_{39}$ is provided for purposes of energizing the sensors 41 and 45, comparators 43 and 49, monostable, retriggerable device 46 and differentiating network 59 etc. The AC to DC converter 39 as indicated may comprise a conventional network of this type formed as shown by a zener diode $Z_D$ limiting the AC input voltage, a rectifier diode D and a smoothing capacitor C. By provision of the amplitude limiting associated with zener diode $Z_D$ it is assured that the potential $U_{AB}$ across terminals A and B can vary over a wide range without resulting in a corresponding change in the output voltage $U_{39}$ of the AC to DC converter 39. The AC to DC converter 57 as shall be seen below, may take precisely the form as the AC to DC converter 39 except the amplitude limiting function of the zener diode $Z_D$ is omitted since here it is desired, as shall be seen below, that the output voltage provided thereby change as a function of the AC voltage across terminals A and B.

In the embodiment of the invention illustrated in FIG. 4, the sensor 41 which may correspond to the sensor 1 in FIG. 2 is employed to provide output pulses $S_{EL}$ as a function of detected signal changes $dS_{in}/dt$ employing conventional differentiating techniques. The output of the sensor 41 is supplied to a first input (+) of a comparator 43 which may be conventional and acts in the well known manner to compare inputs supplied at the terminal connected to the sensor 41 with a reference input derived from $U_{39}$ also and to provide an output $U_{43}$ as a function of the measure of the comparison of the input signal impulses $S_{EL}$ with the supplied reference potential $U_{ref}$.

The reference signal $U_{ref}$ provided to the comparator 43 is additionally generated by a further sensor 45 which may comprise a conventional light sensor and acts as a brightness sensor for purposes of developing a reference voltage for the comparator 43 which is dependent on ambient conditions. More particularly, actual ambient conditions are detected by the sensor 45 and compared by a comparator 44 with an adjustable reference level derived from $U_{39}$ also. This enables the comparator 44, which may take any conventional form of comparator device, to produce an output which is summed with a manually adjustable reference level $U_{refm}$ to provide a reference level to the comparator 43 which is dependent on ambient light conditions. If the load 37 is e.g. a room-light it might not be desirable to have such a light lighted during the day. The sensor 45 will detect daylight conditions and provide for a reference signal $U_{ref}$ which inhibits comparator 43 from providing the output pulses $U_{43}$ even when infrared signals are detected at sensor 41.

The output of the comparator 43 in the form of pulses $U_{43}$ is provided to a triggerable monostable device 46 through a comparator 60. Retriggerable monostable device or Monoflop 46 may take precisely the same form described in association with the monostable device 17 illustrated in FIG. 2 and is here employed as described in FIG. 2 with an adjustable timeset $t_{46}$ for controlling the duration of the duty cycle thereof. The duty cycle of the monostable device 46, as shall be seen below, is employed for purposes of determining the undisturbable on cycle of the illumination load 37 which is being controlled, i.e. it prevents load generated transients from influencing its switching on condition as was explained above.

The output of the monostable device 46 is supplied to a first input of heterodyne unit 47 which may take the form of a summing junction, a summing amplifier or the like while the second input to the heterodyne unit 47 is provided by an adjustable supply 53 itself supplied by voltage $U_{39}$. The sum output of the heterodyne unit 47 is applied to one input of a comparator 49 which may take precisely the same form as comparator 29 illustrated in FIG. 3. The sum output acts as a reference value for the comparator 49 in that the same is set by way of setting the adjustable source 53 so that for an output signal at the monostable device 46 corresponding to the sensing of a condition for which the lighting load is to be actuated, e.g. occurrence of infrared signal at night, the voltage $U_{AB}$, across the terminals AB will exceed the set reference value for the comparator 49.

Conversely, if the monostable device 46 is not in its set state, the amplitude values of the voltage across the terminals AB will not result in an exceeding of the reference value supplied from the heterodyne unit 47 to the comparator 49. Thus the reference conditions imposed by the adjustable potential source 53 are such that if the monostable device 46 is in a set condition, some portion of the amplitude across the terminals AB will exceed the reference level supplied by the heterodyne unit 47. If the monostable device 47 has not been set or has completed the interval associated with its adjustable retriggerable duty cycle no portion of the voltage $U_{AB}$ will exceed the reference potential supplied to the positive input of the comparator device 49.

The negative input to the comparator 49 is connected, as indicated in FIG. 4 directly to the B terminal. If desirable, as is also indicated in FIG. 4, the voltage present at terminals AB may be supplied to the negative input of the comparator 49 through a two-way rectifier 55 which provides further for attenuation K. This is to generate, as will be seen, triac control pulses in each half-cycle of the supply AC-voltage. The output of the comparator 49 is connected as indicated directly to the triggering gate of the triac 51 and acts, as will be readily appreciated by those of ordinary skill in the art, to render the same conductive and hence control conduction across the switch span indicated by the terminals AB.

In operation of the portion of the embodiment of the invention illustrated in FIG. 4, which has been described to this point, it will be seen that when a signal change $\pm dS_{in}/dt$ is detected at the input of sensor 41 a pulse $S_{e1}$ is generated at the output of the sensor 41. If the pulse $S_{e1}$ generated as a result of the change in infrared energy detected is sufficiently large so that the same exceeds the reference value $U_{ref}$ provided to the negative input of the comparator unit 43, an output $U_{43}$ is generated by the comparator 43 thus e.g. only at night. This output acts to trigger the retriggerable monostable device 46. The monostable device 46 will remain in its set state so long as further changes in input $dS_{in}/dt$ are detected by the sensor 41 which exceed the reference level of the comparator 43 to cause a retriggering of the monostable 46 for an interval associated with the duty cycle of the monostable device 46. In a retriggerable monostable device known as retriggerable monoflop, each time it is triggered the output pulse-duration is enlarged by one duty cycle time span.

When the monostable device 46 is thus placed in its set state the comparator 49 receives a reference signal which is smaller than the voltage amplitude $U_{AB}$ across the terminals AB. For a non-conducting switched triac 51 in this condition, the entire supply voltage resides across the terminals AB. When the supply voltage $U_{AB}$ reaches at a defined phase angle the reference value set at the positive input to the comparator 49, the output of the comparator 49 connected to the gate of triac 51 will fire the triac. As well known to those of ordinary skill in the art, once rendered conductive the triac 51 will remain conductive until its current passes zero so that, during the time span that the triac 51 is conductive, the supply voltage applied to the load circuit 35 will be placed across load 37 while the voltage across the terminals A and B is now practically zero. Should the monostable device 46 remain in its set state through a corresponding sequence of detected signal changes a continuous phase cutting of the voltage $U_{AB}$ will result in the manner indicated by the portion of the wave form $U_{AB}$ illustrated in FIG. 4. Those of ordinary skill in the art will appreciate that for the operating conditions described in relation to the terminals AB when the load 37 is inoperative due to an open condition of the triac 51 the DC output associated with the AC to DC converters 39 and 57 will be of higher magnitude than when the triac 51 is in a switching condition. To avoid these conditions influencing the output of the AC to DC converter 39, a zener diode ZD is provided to establish a limit on to a value $U_{ZD}$ as shown in FIG. 4, below the value $U_{AB}$ corresponding to the phase cutting angle installed. This ensures that the output potential $U_{39}$ associated with the converter 39 remains constant even when the phase cutting action of triac 51 is started.

Once the monostable device 46 has been set, if no further output signals $S_{e1}$ are generated by the sensor 41, the monostable will return to its normal condition upon the expiration of the interval $T_{46}$ associated with the adjustable duty cycle thereof. Once this has occurred the reference value $U_{46}$ supplied to the positive terminal of comparator 49 will change in such manner that the peak values of the supply voltage at AB supplied to the comparator 49 does no longer reach the reference signal at the output of unit 47. This will cause triggering signals applied from the output of the comparator 49 to the triac 51 to terminate. Thus, under these conditions the triac will be extinguished as soon as its current passes through zero. At this point, power being supplied to the lighting load 37 will terminate. Hence, those of ordinary skill in the art will appreciate that the output of the monostable 46 is employed as to define the criterion for turning off or on the lamp 37.

The additional AC to DC converter 57 is provided to avoid a condition where actual de-energization of the lighting load improperly results in retriggering the monostable device 46 as was explained for instance in conjunction with FIG. 2. More particularly, when the load 37 is de-energized it is possible that the signal changes generated thereby will be detected by the sensor 41 and act to trigger the monostable device 46 again unless a dead zone associated with the change in illumination associated with the deactivation of the lighting load 37 is established. In order to prevent such a condition, the AC to DC converter 57 is provided and, as aforesaid, this converter may take the same form as the converter 39 with the single exception that the zener diode ZD present within the AC to DC converter 39 together with its associated amplitude limitation is not employed.

Under these circumstances the AC to DC converter 57 will convert AC voltage across the terminals AB into a DC voltage $U_{57}$ in much the same manner described for the AC to DC converter 39. Here, however, since there is no amplitude limitation associated with a level $U_{ZD}$ in FIG. 4, this voltage will change according to whether the entire supply voltage resides across the terminals AB or the voltage which is present in phase cut in the manner described above in conjunction with switching on load 37 through triac 51.

When the entire voltage resides across the terminals AB, the DC output of the AC to DC converter $U_{57}$ will have a first value. However, when the voltage is phase cut in the manner illustrated by the wave form, the voltage $U_{57}$ will be markedly changed, i.e. will drop in magnitude.

The output of the AC to DC converter 57 is connected in the manner indicated in FIG. 4 to a differentiating network 59. The differentiating network may take the form of a highpass filter or the like having a time constant $T_{59}$ which is preferably adjustable. The output of the differentiating network 59 is supplied to a comparator 60 as a reference level. The comparator 60 may take any of the conventional forms of this well known class of device and here acts effectively as a time switched gate between the output of the comparator 43 and the monostable device 46. Thus, those of ordinary skill in the art will appreciate that when the triac 51 stops its switching action and the lighting load 37 is thus de-energized, the voltage output $U_{57}$ of the AC to DC converter 57 will be markedly changed i.e. rise in magnitude for the reasons aforesaid. This change will cause the differentiating network 59 to provide an output spike which will exponentially decay in the manner illustrated in FIG. 4 as a function of the time constant of network 59. Until the spiked output of the differentiator 59 is reduced to a predetermined level, its presence as a reference input to the comparator 60 will prevent any of the outputs from the comparator 43 in the form of pulses $U_{43}$ from being applied to the monostable device 46 to cause triggering thereof. This thus creates an inhibit zone upon switching off of the lighting load 37 so that the lighting load itself does not create a condition so as to continue energization of itself.

Those of ordinary skill in the art will appreciate that the various embodiments of the instant invention described enable infrared sensors or the like exhibiting high sensitivity to be employed for automatically switching lighting loads and other loads which themselves generate signals detected by the sensors. Furthermore, the embodiments of the invention described in association with FIGS. 3 and 4 enable embodiments of this invention to be installed into existing, manually operated lighting arrangements without a need to separately provide power sources, re-wiring or the like and are thus highly advantageous.

While the instant invention has been described in connection with several highly specific exemplary embodiments thereof, it will be understood that many modifications and variations thereof shall be readily apparent to those of ordinary skill in the art. Therefore it is manifestly intended that this invention be only limited by the claims and the equivalents thereof.

We claim:

1. Apparatus for automatically controlling the operative condition of a load comprising:
    switch means connected to said load for selectively controlling the operative state thereof;
    sensor means for sensing a condition and generating signals defining a presence of said condition;
    means responsive to signals generated by said sensor means for causing said switch means to place said load in energized and de-energized states, said load generating, in changing from at least one of said energized and de-energized states, energy capable of influencing said sensor means in sensing said condition; and
    means for inhibiting said means responsive for a selected time interval beginning simultaneously with a change from at least one of said energized and de-energized states of said load.

2. The apparatus according to claim 1 wherein said means for inhibiting includes means for inhibiting said means responsive for a selected time interval after a change in the state of said load from an energized to a de-energized state and from a de-energized to an energized state.

3. The apparatus according to claim 1 wherein said means responsive includes means for assuming a first condition for a predetermined time interval and thereafter reverting to a second condition, said means for assuming a first condition causing said switch means to place said load in an energized state whenever said means for assuming is in said first condition and to place said load in a de-energized state when said means for assuming is in said second condition, said means for assuming being resettable to restart said predetermined time interval upon further sensing of a condition by said sensor means when said means for assuming is in said first condition.

4. The apparatus according to claim 3 wherein said means for inhibiting includes means for preventing said means for assuming a first condition from being set to said first condition for a defined period after reverting to said second condition has occurred.

5. The apparatus according to claim 1 wherein said means responsive acts to place said switch means in a first state to place said load in a de-energized state and to intermittently switch in a sequential manner said switch means between said first state and a second state to place said load in an energized state.

6. The apparatus according to claim 5 wherein said switch means takes the form of a solid state device for receiving AC voltage and applying operating voltage to said load and said means responsive acts to control the conductivity of said solid state device as a function of the phase angle of said AC voltage.

7. The apparatus according to claim 6 wherein said means for inhibiting includes means for generating a signal representative of the condition of said solid state device, said means for generating producing a first signal when said solid state device is in an open condition and a second signal when said solid state device is intermittently placed in first and second states.

8. The apparatus according to claim 7 wherein said means responsive includes means for assuming a first condition for a predetermined time interval and thereafter reverting to a second condition, said means for assuming a first condition causing said switch means to place said load in an energized state whenever said means for assuming is in said first condition and to place said load in a de-energized state when said means for assuming is in said second condition, said means for assuming being resettable to restart said predetermined time interval upon further sensing of a condition by said sensor means when said means for assuming is in said first condition.

9. The apparatus according to claim 8 wherein said means for inhibiting includes means for preventing said means for assuming a first condition from being set to said first condition for a defined period after reverting to said second condition has occurred.

10. The apparatus according to claim 9 wherein said means for preventing is responsive to said second signal.

11. The apparatus according to claim 6 wherein said means responsive includes means for generating a signal, said means for generating being connected across said solid state device and including means for limiting the amplitude of input information applied thereto to produce a signal of substantially the same value when said solid state device is in an open condition and when said solid state device is intermittently placed in first and second states, said means for generating a signal providing power to at least said means responsive.

12. The apparatus according to claim 3 wherein said predetermined time interval is adjustable.

13. The apparatus according to claim 1 wherein said sensor means comprises an infrared sensor and a comparator means, said infrared sensor being connected to a first input of said comparator means and a reference input being supplied to a second input of said sensor means.

14. The apparatus according to claim 13 wherein said reference input is representative of ambient conditions.

15. A method of automatically controlling the operative condition of a load comprising the steps of:
    sensing a condition and generating signals defining a presence of said condition;
    causing switch means to place said load in energized and de-energized states in response to signals defining a presence of said condition, said load generating, in changing from at least one of said energized and de-energized states, energy capable of influencing said sensing; and
    inhibiting said switch means for a selected time interval beginning simultaneously with a change in at least one of said energized and de-energized states of said load.

16. The apparatus according to claim 1 wherein said inhibiting means is for inhibiting said means responsive for an adjustable time interval.

17. An apparatus for automatically controlling the operative condition of a load comprising:
  switch means, coupled to said load, having a control input terminal, for selectively controlling the operative state of said load in response to a switch state control signal;
  sensor means, having an output terminal, for sensing a condition and generating at said output terminal signals defining a presence of said condition;
  control means, responsive to said signals generated by said sensor means, for causing said switch means to place said load in energized and de-energized states; and
  inhibit means, coupled to said control means, for inhibiting said control means from changing an operative state of said switch means for a selected time interval beginning simultaneously with a change in said operative state of said switch means.

18. An apparatus according to claim 17 wherein said inhibit means comprises signal switching means for switching a signal from said output terminal of said sensor means to said control input terminal of said switch means, said signal switching means being controlled by an input control signal; wherein said control means comprises a retriggerable monostable unit which is triggered and retriggered by said signals generated by said sensor means, and which generates an output signal, said switch state control signal being dependent on said output signal of said retriggerable monostable unit, said monostable unit being triggered in response to said switch state control signal and generating an output signal, said input control signal of said signal switching means being dependent on said output signal of said monostable unit.

19. An apparatus according to claim 17 further comprising:
  clock means for intermittently switching said switch means on and off while in a load energized operative state;
  an AC/DC converter, having an input terminal for sensing a voltage across said switch means, and having an output terminal for generating a DC supply signal.

20. An apparatus according to claim 19 further comprising an AC supply source coupled to said load, and wherein said clock means provides a phase angle-cut control for said voltage across said switch means.

21. An apparatus according to claim 19 further comprising detector means for detecting a change in said operative state, an output signal of said detector means controlling said inhibit means.

22. An apparatus according to claim 21 wherein said detector means comprises a second AC/DC converter, having an input terminal for sensing said voltage across said switch means.

23. An apparatus according to claim 19 wherein said AC/DC converter comprises means for limiting an amplitude of an output signal, including a zener diode circuit.

24. An apparatus according to claim 22 further comprising a time unit, coupled to said second AC/DC converter, including a differentiating unit having a selected time constant.

25. An apparatus according to claim 17 wherein said control means comprises a comparator unit coupled to said sensor means; and further comprising an adjustable reference signal source coupled to said comparator unit.

26. An apparatus according to claim 25 further comprising second sensor means, coupled to said adjustable reference signal source, for sensing ambient conditions.

27. An apparatus according to claim 17 further comprising a reference signal source for providing a reference signal; and wherein said control means comprises a comparator unit coupled to said sensor means and said reference signal source; and wherein said inhibit means is coupled to said reference signal source for controlling said comparator unit by varying said reference signal.

28. An apparatus according to claim 17 wherein said sensor means comprises an infrared sensor.

29. An apparatus according to claim 26 wherein said sensor means comprises an infrared sensor and wherein said second sensor means comprises a brightness sensor.

30. An apparatus according to claim 17 wherein said inhibit means is for inhibiting said control means from changing an operative state of said switch for an adjustable time interval.

31. A method of preventing a change in an operative state of a load from influencing a sensor in a control apparatus having means for sensing a condition, means for switching said load, and means, coupled between said sensing means and said switching means, for controlling said switching means, comprising:
  inhibiting said controlling means from changing an operative state of said switching means for a selected time interval beginning simultaneously with a change in an operative state of said switching means.

32. The method according to claim 31 wherein said sensing means senses transients of sensed conditions, and wherein said inhibiting step comprises:
  generating a first signal for a first predetermined time interval beginning simultaneously with an occurrence of a first transient;
  lengthening said first signal by a time interval between a second transient occurring during said first signal and said first transient;
  generating a second signal having a second predetermined time interval beginning simultaneously with an end of said first signal; and
  inhibiting further transients from causing a third signal corresponding to said first signal from being generated during said second predetermined time interval.

33. The method according to claim 31 wherein said switching means is connected in series between a load supply and said load, and wherein the inhibiting step comprises:
  operating said switching means to intermittently energize said load;
  converting a voltage across said switching means to a DC voltage; and
  utilizing said DC voltage as a source of DC supply power for said apparatus.

34. The method according to claim 33 wherein said load supply comprises an AC supply, and said step of operating comprises performing phase angle-cut control.

35. The method according to claim 31 wherein said inhibiting step comprises:
  intermittently operating said switching means for energizing said load;
  converting a voltage across said switching means into a DC supply voltage of a magnitude substantially independent of whether said load is energized or not;
detecting energized and de-energized states of said switching means;
generating, in response to a change in said operative state of said switching means, a signal having a predetermined time interval beginning simultaneously with said change; and,
disabling, in response to said signal, said switching means from changing said state.

* * * * *